(12) United States Patent
Bateman et al.

(10) Patent No.: US 8,465,909 B2
(45) Date of Patent: Jun. 18, 2013

(54) SELF-ALIGNED MASKING FOR SOLAR CELL MANUFACTURE

(75) Inventors: Nicholas P. T. Bateman, Reading, MA (US); Helen L. Maynard, North Reading, MA (US); Benjamin B. Riordon, Newburyport, MA (US); Christopher R. Hatem, Salisbury, MA (US); Deepak Ramappa, Boston, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 351 days.

(21) Appl. No.: 12/916,993

(22) Filed: Nov. 1, 2010

(65) Prior Publication Data

US 2011/0104618 A1    May 5, 2011

Related U.S. Application Data

(60) Provisional application No. 61/257,994, filed on Nov. 4, 2009.

(51) Int. Cl.
*G03F 7/20* (2006.01)

(52) U.S. Cl.
USPC .......................................................... 430/325

(58) Field of Classification Search
USPC ........................................ 430/322, 324, 325
See application file for complete search history.

(56) References Cited

U.S. PATENT DOCUMENTS

| | | |
|---|---|---|
| 5,436,174 A | 7/1995 | Baliga et al. |
| 2004/0118805 A1 | 6/2004 | Hareland et al. |
| 2009/0068783 A1 | 3/2009 | Borden |
| 2009/0227094 A1 | 9/2009 | Bateman et al. |
| 2009/0227095 A1 | 9/2009 | Bateman et al. |

*Primary Examiner* — Brittany Raymond

(57) ABSTRACT

Various methods of utilizing the physical and chemical property differences between amorphized and crystalline silicon are used to create masks that can be used for subsequent implants. In some embodiments, the difference in film growth between amorphous and crystalline silicon is used to create the mask. In other embodiments, the difference in reflectivity or light absorption between amorphous and crystalline silicon is used to create the mask. In other embodiments, differences in the characteristics of doped and undoped silicon is used to create masks.

14 Claims, 6 Drawing Sheets

SELF-ALIGNED MASKING FOR SOLAR CELL MANUFACTURE

This application claims priority of U.S. Provisional Patent Application Ser. No. 61/257,994, filed Nov. 4, 2009, the disclosure of which are incorporated herein by reference in its entirety.

FIELD

This invention relates to ion implantation of a solar cell and, more particularly, to a method of implanting a solar cell and changing the properties of the solar cell substrate to affect subsequent implant steps.

BACKGROUND

Ion implantation is a standard technique for introducing conductivity-altering impurities into substrates. A desired impurity material is ionized in an ion source, the ions are accelerated to form an ion beam of prescribed energy, and the ion beam is directed at the surface of the substrate. The energetic ions in the beam penetrate into the bulk of the substrate material and are embedded into the crystalline lattice of the substrate material to form a region of desired conductivity.

Solar cells provide pollution-free, equal-access energy using a free natural resource. Due to environmental concerns and rising energy costs, solar cells, which may be composed of silicon substrates, are becoming more globally important. Any reduced cost to the manufacture or production of high-performance solar cells or any efficiency improvement to high-performance solar cells would have a positive impact on the implementation of solar cells worldwide. This will enable the wider availability of this clean energy technology.

Solar cells may require doping to improve efficiency. The dopant may be, for example, arsenic, phosphorus, or boron. FIG. 1A is a cross-sectional view of an interdigitated back contact (IBC) solar cell. In the IBC solar cell, the p-n junction is on the back side of the solar cell. As shown in FIG. 1B, the doping pattern includes alternating p-type and n-type dopant regions in this particular embodiment. The p+ emitter 203 and the n+ back surface field 204 are appropriately doped. This doping may enable the junction in the IBC solar cell to function or have increased efficiency.

Some solar cells, such as IBC solar cells, require that different regions of the solar cell be p-type and others n-type. It may be difficult to align these various regions without overlap or error. For example, the p+ emitter 203 and n+ back surface field 204 in FIG. 1B must be doped. If overlap between the p-type regions 203 and the n-type regions 204 exists, counterdoping may occur. Any overlap or misalignment also may affect the function of the solar cell. For solar cells that require multiple implants, particularly those with small structure or implant region dimensions, the alignment requirements can limit the use of a shadow mask or proximity mask. In particular, as shown in FIG. 1B, an IBC solar cell requires alternating lines doped with, for example, B and P. Therefore, any shadow mask or proximity mask for the B implant has narrow, long apertures that are carefully aligned to the small features that were implanted with P using a different proximity mask or shadow mask.

Accordingly, there is a need in the art for an improved method of implanting a solar cell and, more particularly, a method of using an implanted region of a solar cell as a mask for subsequent implants.

SUMMARY

Various methods of utilizing the physical and chemical property differences between amorphized and crystalline silicon are used to create masks that can be used for subsequent implants. In some embodiments, the difference in film growth between amorphous and crystalline silicon is used to create the mask. In other embodiments, the difference in reflectivity or light absorption between amorphous and crystalline silicon is used to create the mask. In other embodiments, differences in the characteristics of doped and undoped silicon is used to create masks.

BRIEF DESCRIPTION OF THE DRAWINGS

For a better understanding of the present disclosure, reference is made to the accompanying drawings, which are incorporated herein by reference and in which.

DETAILED DESCRIPTION

Embodiments of this system are described herein in connection with solar cells. However, the embodiments of this system can be used with, for example, semiconductor wafers or flat panels. The implanter may be, for example, a beamline or plasma doping ion implanter. Thus, the invention is not limited to the specific embodiments described below.

Figure 1A:
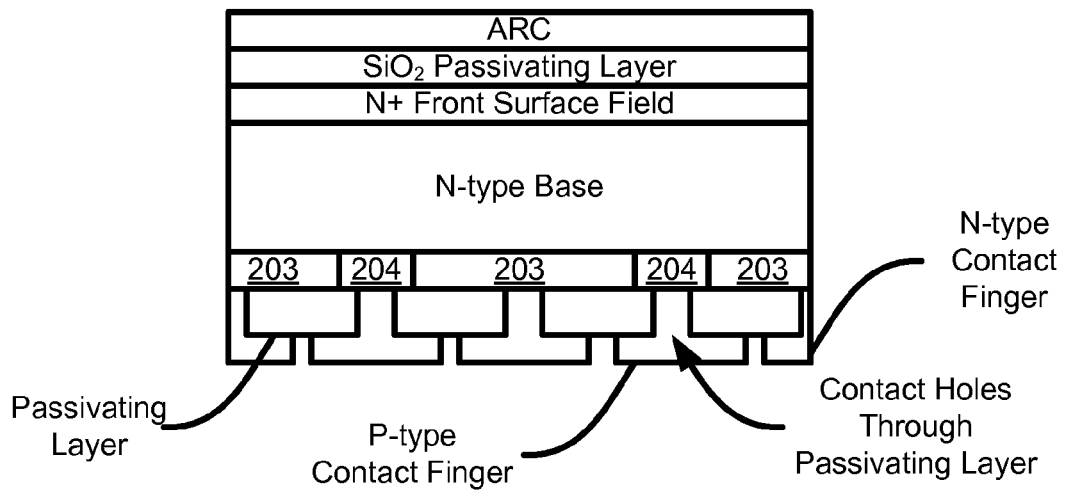
FIG. 1A is a cross-sectional view of an interdigitated back contact solar cell.
Figure 1B:
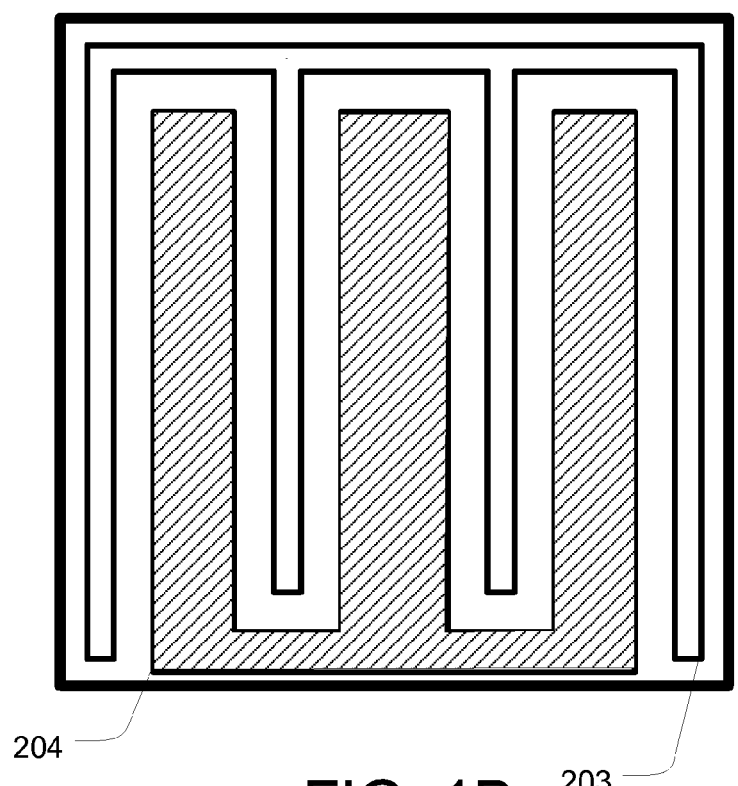
FIG. 1B is a bottom view of an interdigitated back contact solar cell.
Figure 2:
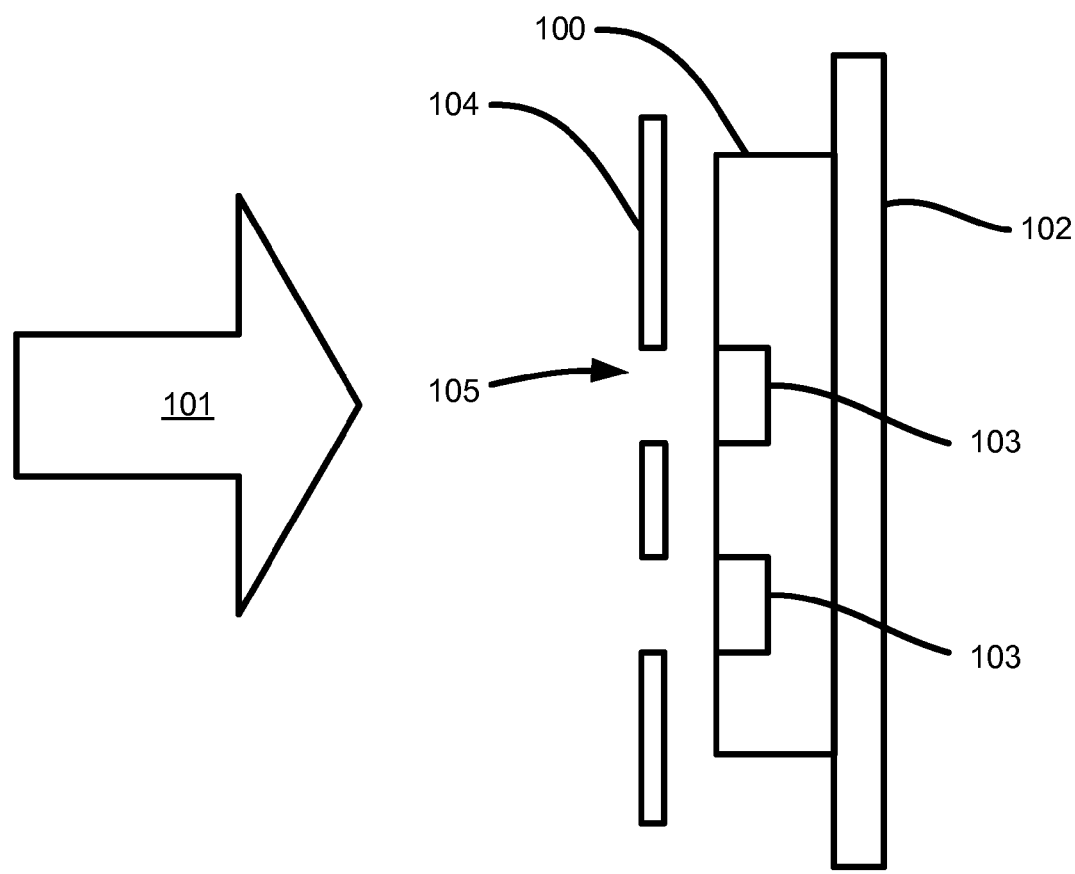
FIG. 2 is a cross-sectional view of implantation through a mask.

FIG. 2 is a cross-sectional view of implantation through a mask. When a specific pattern of ion implantation in a substrate 100 is desired, a mask 104 may be used. This mask 104 may be a shadow or proximity mask. The mask 104 is placed in front of a substrate 100 in the path of an ion beam 101. The substrate 100 may be, for example, a solar cell. The substrate 100 may be placed on a platen 102, which may use electrostatic or physical force to retain the substrate 100. The mask 104 has apertures 105 that correspond to the desired pattern of ion implantation in the substrate 100. The apertures 105 may be stripes, dots, or other shapes. The implant into the solar cell 100 passes through the apertures 105 in the mask 104. Thus, only the implanted regions 103 are formed. The implanted regions 103 may correspond to, for example, the p+ emitter 203 in the IBC solar cell of FIG. 1. The implanted region 103 may become amorphized due to the implant, while the rest of the solar cell 100 remains as crystalline silicon. Use of the mask 104 eliminates process steps, such as silkscreening or lithography, required for other ion implantation techniques. As disclosed in the embodiments herein, a later implant may implant either the implanted region 301 or some other region of the solar cell 300.

For solar cell structures that require multiple implants, the first implant, such as that described in FIG. 2, may be used to create a mask for subsequent implants. Referring to FIG. 2, regions 103 are implanted with ions due to their exposure to the ion beam 101. These implanted amorphized regions have different surface or crystal properties than an un-implanted crystalline region because of the randomized crystal structure. These different properties may be used to mask either the amorphized region 103 for implants that are complementary (e.g., adjacent) or to mask the crystalline region for implants that must be on top of one another in the same region. The first implant may be performed through a shadow or proximity mask, as shown in FIG. 2, or using some other patterning technique known to those skilled in the art. This first implant, which may have a large P dose, for example, will amorphize a portion of the surface of the solar cell. The amorphized regions will have different material properties that can be used to generate a mask for subsequent implants.

Figure 3:
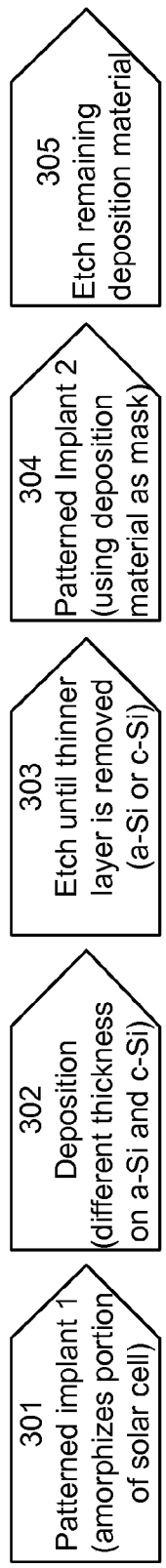
FIG. 3 is a flowchart of a first solar cell manufacturing process.

FIG. 3 is a flowchart of a first solar cell manufacturing process. In step 301, a first patterned implant that amorphizes the implanted portion of the solar cell is performed. Like all embodiments herein, a shadow or proximity mask may be used for this patterned implant. This creates a solar cell having a surface having both armorphized and crystalline regions. After the patterned implant is completed, the mask is removed from the substrate.

After the amorphizing implant 300, a substance, such as an oxide or other materials that can stop or block an implanted beam, is then deposited or grown on the solar cell, as shown in step 302. The material is selected such that its rate of growth or deposition will be different on the amorphized (a-Si) and crystalline (c-Si) portions of the solar cell. For instance, oxide growth is greater on amorphous silicon than on crystalline silicon. Thus, after deposition step 302, the oxide will be thicker on the amorphous silicon (i.e. previously implanted regions) than on the crystalline silicon (i.e. unimplanted silicon).

After deposition or growth, the substrate is cleaned or etched to expose the desired regions, as shown in step 303. For example, a plasma etch could be used to remove silicon oxide evenly such that it is removed entirely from the crystalline silicon regions but not entirely from the amorphized regions. This may be at least partly because the oxide is thicker on the amorphous region.

A second implant into different regions of the solar cell than the first patterned implant is then performed, as shown in step 304. Since deposition material remains on the previously implanted regions, only those regions which were not implanted by patterned implant 1 (step 301) are implanted at this time.

After the second patterned implant is completed, the deposited layer or mask is then etched away, as shown in step 305. An anneal may then be performed to activate the implants.

Figure 4:
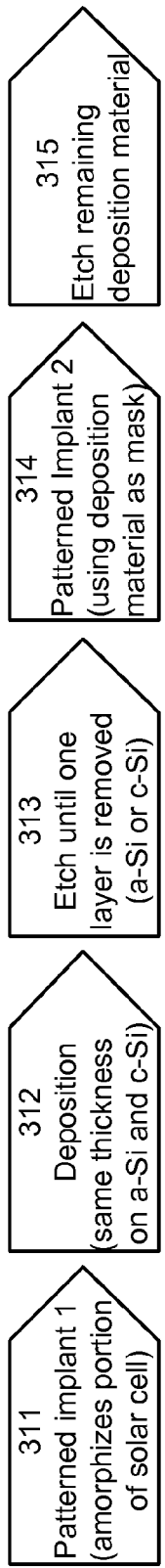
FIG. 4 is a flowchart of a second solar cell manufacturing process.

FIG. 4 is a flowchart of a second solar cell manufacturing process. In step 311, a first patterned implant that amorphizes the implanted portion of the solar cell is performed. After the patterned implant is completed, the mask is removed from the substrate.

A substance that can stop the ion beam is deposited or grown evenly on both the amorphized and crystalline regions of the solar cell, as shown in step 312. The thickness of this protective layer does not differ between amorphized and crystalline regions of the solar cell.

Although the thickness of the protective layer is uniform after deposition step 312, the protective layer is etched at different rates from the amorphous silicon and the crystalline silicon. The properties of the protective layer are different because the surface of the solar cell under each region is different. For example, the spacing between atoms on the surface of the solar cell is different between the crystalline and amorphized regions. This lattice constant may have an effect on the crystalline structure or the stoichiometry of the substance grown on top of it. In turn, this crystalline structure or stoichiometry may affect the etch rate. The protective layer is etched until one of the regions is exposed, as shown in step 313. In other words, this protective layer may predominantly remain on the crystalline silicon while it is predominantly removed from the amorphous silicon. In another embodiment, the protective layer predominantly remains on the amorphous silicon while it is predominantly removed from the crystalline silicon.

A second patterned implant is then performed, as shown in step 314. Because of the location of the protective layer, the second implant may be aligned to the first patterned implant. Depending on which portion of the substrate retained the protective layer, the first and second pattern implants may implant the same or different regions of the solar cell.

The protective layer or mask is then etched off, as shown in step 315. An anneal may then be performed to activate the implants.

Figure 5:
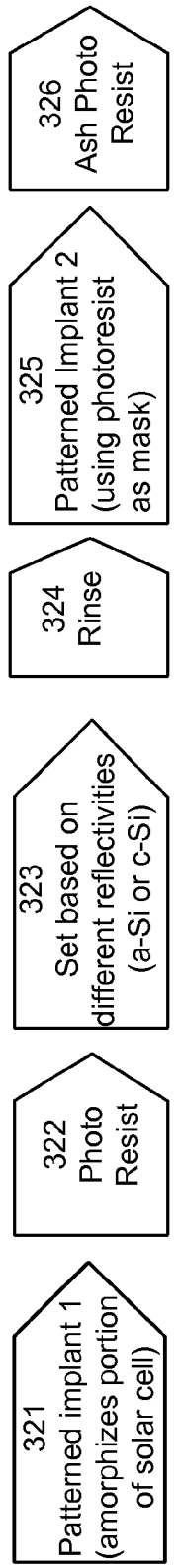
FIG. 5 is a flowchart of a third solar cell manufacturing process.

FIG. 5 is a flowchart of a third solar cell manufacturing process. A first patterned implant that amorphizes the implanted portion of the solar cell is performed, as shown in step 321. After the patterned implant is completed, the mask is removed from the substrate.

A photoresist is then spun onto the solar cell and the thickness of this photoresist is controlled, as shown in step 322. Different photoresist materials may be used including H-line, I-line, wide-band, deep-UV, or any photoactive film where light alters its properties, such as its solubility. Photoresist thickness is controlled by the wafer spin speed. Different photoresists have differing viscosities. A photoresist is characterized by spinning it at different speeds to understand the resulting thickness. This technique is known to those skilled in the art.

There are two major types of photoresist. Positive photoresist sets in the presence of light, leaving the unexposed photoresist susceptible to removal. Negative photoresist operates in the opposite manner, where the unexposed photoresist is set and that exposed to the light remains susceptible to removal.

In the case of a positive photoresist, UV or other light is used to set the photoresist such that sufficient light absorption only happens when the light is reflected off the back of the photoresist layer, as shown in step 323. Thus, the different reflectivity of the amorphized and crystalline regions of the solar cell causes the photoresist to set only over the amorphized region of the solar cell. Different photoresists are activated at different wavelengths, such as near-UV, mid-UV, and deep-UV. The wavelength of interest is determined by what "activates" the photoresist, i.e. what wavelength changes it from soluble to insoluble (or vice-versus). The film thickness is then typically on the order of a wavelength (+/− a factor of 2). In some embodiments, the photoresist thickness is between 80 and 500 nm. In some embodiments, light with wavelengths between 100 nm and 2000 nm may be applied to the surface.

In the case of a negative photoresist, the UV light is used to prevent the photoresist from setting on a portion of the solar cell. This may be due to properties in the photoresist. For example, the greater amount of light reflected by the amorphized region may be sufficient to insure that the negative photoresist in that region does not set. Meanwhile, the lesser amount of reflected light in the crystalline region enables the negative photoresist in that region to set.

In either case, the photoresist thickness and formulation may be chosen to achieve the highest difference in reflectivity between the crystalline and amorphous regions of the solar cell at blue wavelengths. The wavelengths may be around 450 nm in one embodiment. Light may be incident on the photoresist at an angle, which in one instance is approximately 70°. To optimize the difference in absorption between the amorphous and crystalline regions of the solar cell, a stack of two or more photoresist layers may be required. These multiple photoresist layers would be configured to have the proper thickness and refractive index.

In one particular embodiment, a photoresist having a thickness of 2500 A is applied to a solar cell, having implanted regions 300 A thick. At about 600 nm, there may be a 30% increase in the amount of light reflected by the amorphous silicon, as compared to the crystalline silicon. Wavelengths of 450 nm may result in more significant differences in reflectivity.

In another embodiment, polarized light is applied to the substrate. In some cases, the use of polarized light may increase the difference in reflectivity between amorphous silicon and crystalline silicon.

After sufficient time has elapsed to allow the photoresist to properly set in the desired regions, any photoresist that has not set may be rinsed off, as shown in step 324.

As shown in step 325, a second implant is then performed. The second implant may be aligned with the first patterned implant or may implant the unimplanted crystalline regions of the solar cell.

The photoresist is then asked off or removed in other ways, as shown in step 326. An anneal may then be performed to activate the implants.

Figure 6:
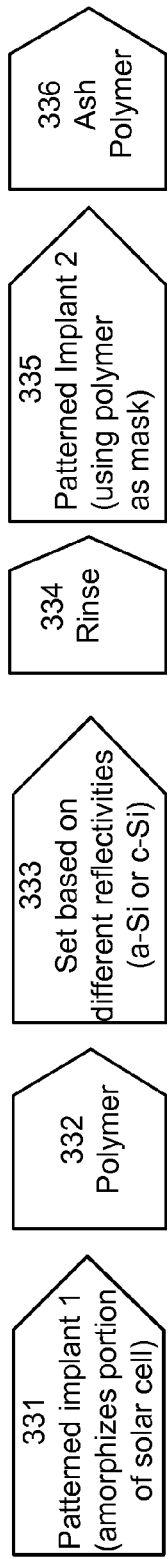
FIG. 6 is a flowchart of a fourth solar cell manufacturing process.

FIG. 6 is a flowchart of a fourth solar cell manufacturing process. A first patterned implant that amorphizes the implanted portion of the solar cell is performed, as shown in step 331. After the patterned implant is completed, the mask is removed from the substrate.

A thermal polymer is then spun onto the solar cell, as shown in step 332. In some embodiments, polyamides or melamine formaldehyde may be used. Polyamides are available in formulations that spin on easily. All photoresists require a softbake (or alternatively, a hard bake) to prevent washing away. In other words, all are thermally active, to varying degrees. These bakes are usually on a hot plate and primarily drive out the solvents, leaving a more rigid film behind. In some embodiments, the thermal polymer is applied at a thickness between 100 nm and 50 µm.

The thermal polymer is then set, as shown in step 333. The difference in surface absorption between the amorphous and crystalline regions of the solar cell can be used to determine where the polymer is able to be set. Crystalline silicon may be at least partly transparent in most of the infrared range, thereby remains cool during exposure to infrared light. In contrast, amorphous silicon may absorb some of the infrared range, causing it to heat more than the crystalline silicon. The difference in the depth of absorption is used to thermally set a polymer mask. The solar cell is exposed to infrared light with an intensity configured so that the induced temperature of the polymer over the amorphized regions will be high enough to thermally set the polymer. This intensity also is configured so that the induced temperature of the polymer over the crystalline regions will not be high enough to thermally set the polymer.

In some embodiments, the infrared light is directed at the surface of the solar cell, where the thermal polymer is located. In another embodiment, the infrared light is directed at the back side of the solar cell.

The polymer that is not set is then removed in a chemical rinse, as shown in step 334.

The resulting polymer mask is aligned to the amorphized regions, allowing a second implant of the crystalline regions. The second patterned implant, shown in step 335, can be used to implant the regions of the solar cell which were not previously implanted during step 331.

The polymer is then asked or removed in other ways, as shown in step 336. An anneal may then be performed to activate the implants. In an alternate embodiment, the polymer is set over the crystalline regions of the solar cell instead of the amorphous regions.

In another embodiment, the difference in infrared absorption between amorphous and crystalline silicon is used to create a mask for subsequent implant steps. For example, a sheet of polypropylene, PVC, or some other material could be applied to the surface of a solar cell. The solar cell is then exposed to, for example, infrared light that would heat the amorphized regions of the solar cell more than the crystalline regions of the solar cell. In one instance, the heat of the amorphous silicon would melt the polypropylene and cause it to evolve or sublime from the amorphous regions of the solar cell. In one embodiment, the temperature may be between 100-150° C., for a duration of about 30-60 seconds. The polypropylene barrier would remain intact over the crystalline regions of the solar cell. This remaining polypropylene will provide a hard mask that matches the pattern of the first patterned implant.

Figure 8:
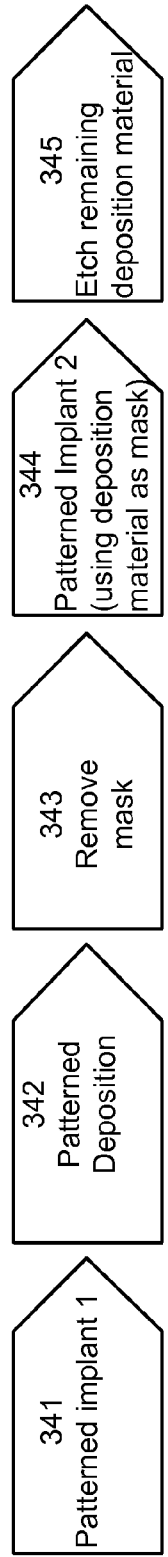
FIG. 8 is a flowchart of a fifth solar cell manufacturing process.

FIG. 8 is a flowchart of a fifth solar cell manufacturing process. A first patterned implant is performed on the solar cell, as shown in step 341. This implant may use a plasma doping ion implanter.

The dopant, voltage and vacuum characteristics of the plasma doping ion implanter then may be changed to deposit a mask over the implanted regions without moving the shadow or proximity mask in the implanter, as shown in step 342. This patterned deposition could be, for example, C or P.

The shadow or proximity mask then may be removed from the implanter, as shown in step 343. A second patterned implant, shown in step 344, may be performed in the regions of the solar cell that were not implanted during the first patterned implant. This allows complementary patterned implants to be performed.

The material deposited during step 342 may then be removed, such as by etching, as shown in step 345.

Figure 9:
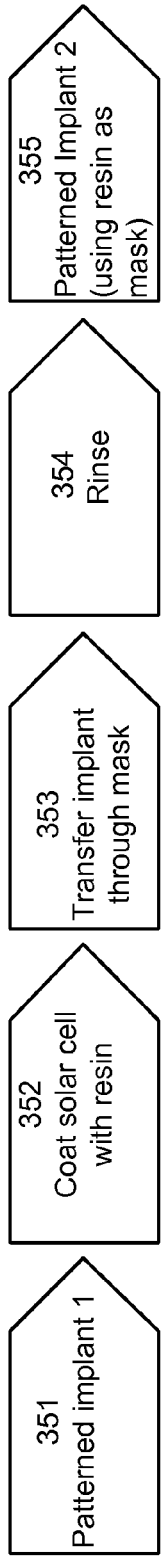
FIG. 9 is a flowchart of a sixth solar cell manufacturing process.

FIG. 9 is a flowchart of a sixth solar cell manufacturing process. A first patterned implant that amorphizes the implanted portion of the solar cell is performed in step 351. In some embodiments, the mask is then removed from the solar cell.

A resin is then coated on the solar cell to form a mask, as shown in step 352. In one instance, the resin coats the entire solar cell surface. In other instances, the resin only coats the portions of the solar cell that are exposed by the mask.

A transfer implant through the proximity or shadow mask and into the resin is then performed in step 353. In one embodiment, the proximity or shadow mask may not be moved between the first and transfer implant. In another embodiment, when a blanket coating of resin is performed, the mask must be re-aligned with the solar cell. This transfer implant sets the resin that is exposed to the implant, while the remainder may be rinsed later. The proximity or shadow mask is removed after the transfer implant. U.S. Pat. No. 5,7055,339 describes the use of cross-linking polyketones as an example.

After the mask is removed, a rinse is performed, as shown in step 354. The resin that was set by this transfer implant remains while the remainder of the resin may be rinsed off.

A second implant, shown in step 355, is then performed in the regions of the solar cell that were not implanted during the first patterned implant.

Figure 10:
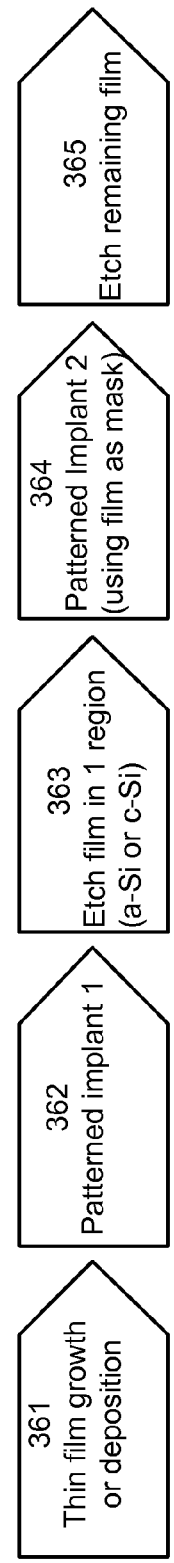
FIG. 10 is a flowchart of a seventh solar cell manufacturing process.

FIG. 10 is a flowchart of a seventh solar cell manufacturing process. A thin film is deposited or grown on the surface of the solar cell before the initial implant, as shown in step 361. The film may have a thickness of between 100-500 nm.

Then a first patterned implant is performed through a shadow or proximity mask, as shown in step 362. This first patterned implant has sufficient energy so that the ions pass through the film into the solar cell. This first patterned implant changes the chemical structure of the film where the implant occurs.

The differing chemistry of the film can then used to create the mask for a second patterned implant. In some embodiments, the differing chemistry is used to selectively etch the film. For example, carbon implanted into silicon dioxide generally decreases its wet etch rate (in HF). P-type polysilicon has a much higher etch rate than undoped polysilicon. Either the implanted or unimplanted regions of the film are removed, as shown in step 363. This may be done using an etching process, or other suitable process.

A second implant is then performed, in step 364, so that the remaining film blocks a portion of this second implant. This second implant may be at a lower energy than the first implant to insure that the ions do not pass through the film.

The remaining film is then etched or otherwise removed as shown in step 365. If the first patterned implant (step 362) made the film more susceptible to the etch, the second implant (step 364) will then implant the same regions of the solar cell as the first implant. If the first implant (step 362) made the film less susceptible to the etch, the second implant (step 364) will implant different regions of the solar cell than the first implant. In both instances, the implanted regions are aligned. The second implant may be of a higher mass ion than the first implant. For example, the first implant may be B and the second implant may be P. In another embodiment, the first implant is Si and merely transfers the pattern of a shadow or proximity mask onto the solar cell.

Figure 11:
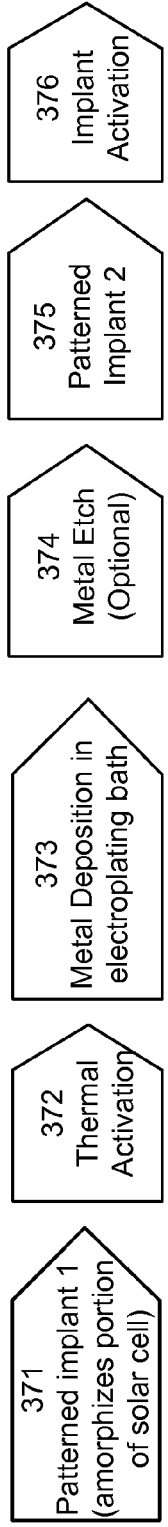
FIG. 11 is a flowchart of an eighth solar cell manufacturing process.

FIG. 11 is a flowchart of an eighth solar cell manufacturing process. In this embodiment, the different conductances of the implanted and unimplanted regions may be used to evolve the material on the surface of the solar cell. A first patterned implant is performed on the solar cell through a shadow or proximity mask, as shown in step 371. The implanted species is preferably a dopant, such as B or P.

To activate the dopants, an anneal, or thermal activation process is performed in step 372. Following the anneal, the doped regions will have a lower resistance than the undoped region.

The solar cell is then placed in an electroplating bath, as shown in step 373. The electrolyte in the bath may consist of a metal electrolyte such as Al, Cu, Ag, or some other species. The plated metal thickness on the doped areas of the solar cell will grow faster than the undoped areas. In one particular example, this process may take between 1 minute and 2 hours, for example.

An optional blanket metal etch may then be performed, as shown in step 374. This metal etch removes equal amounts of metal over both the thicker (i.e., doped) and thinner (i.e., undoped) areas of the solar cell. Thus, metal will remain over the doped regions of the solar cell after this etch is completed.

A second patterned implant is performed using the metal over the doped areas as a mask, as shown in step 375. The second implant, thus, is performed only in the previously undoped areas. In another embodiment, the blanket metal etch is not performed during step 374 and the electroplating (step 373) is followed by the second implant (step 375). In this instance, the energy of the second implant (step 373) is chosen such that the difference in the thickness of the metal over the doped and undoped areas will introduce the dopant from the second implant only in previously undoped areas.

An anneal may then be performed to activate the second implant, as shown in step 376. In one embodiment, the first implant is a p-type implant such as B, Ga, or Al and the electroplated metal is Al.

Figure 12:
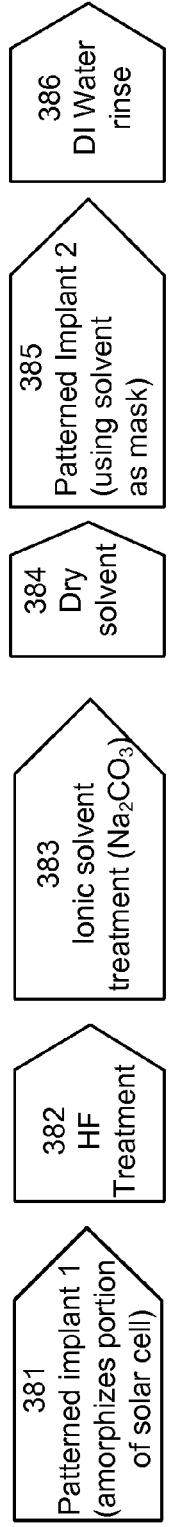
FIG. 12 is a flowchart of a ninth solar cell manufacturing process.

FIG. 12 is a flowchart of a ninth solar cell manufacturing process. Differing surface tension of solutes and solvents on implanted and unimplanted regions may be used to evolve material on the surface. An implanted silicon surface tends to be more hydrophilic than an unimplanted silicon surface. Thus, appropriate solvents may have higher adhesion on the surface of implanted regions than unimplanted regions. An appropriate ionic or covalent solvent can be used to preferentially adhere to the implanted or amorphized regions of the solar cell. When dried, this solvent can leave a deposit on the surface of the solar cell over the implanted or amorphized regions. This can be a mask for a second implant.

In this particular embodiment, a first patterned implant is performed through a shadow or proximity mask as shown in step 381. This first patterned implant may amorphize the solar cell in certain regions.

A HF treatment is performed to render any unimplanted regions hydrophobic, as shown in step 382. A solvent is then applied in step 383. This solvent may be, for example, $Na_2CO_3$ or other suitable chemicals. Pressure and/or heat may be applied to dry the solvent, as shown in step 384.

As shown in step 385, a second patterned implant is then performed into the regions not implanted during the first implant because the dried solvent serves as a mask. A DI water rinse then removes the solvent from the solar cell, as shown in step 386.

In yet another embodiment, the differingسheet resistance of the implanted and unimplanted regions may be used to evolve or sublime the material on the surface of the solar cell. For example, doped silicon has a lower resistivity than undoped silicon, due to the presence of the dopants. Therefore, current will be easily pass through doped regions than undoped regions, and will generate less heat in these regions.

Figure 13:
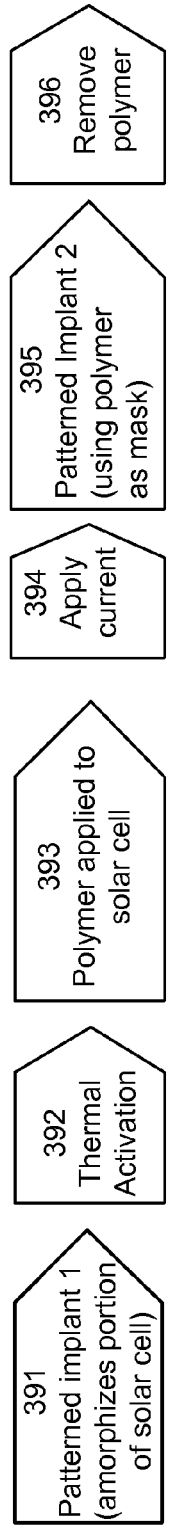
FIG. 13 is a flowchart of a tenth solar cell manufacturing process.

FIG. 13 is a flowchart of a tenth solar cell manufacturing process. In this embodiment, the difference is not based on the differences between amorphous and crystalline silicon. Rather, this embodiment, utilizes the differences in electrical performance between doped and undoped silicon. Therefore, in this embodiment, the dopant in the amorphous regions of the solar cell must be activated.

A patterned implant is performed, as shown in step 391. This implant is done using a dopant, such as B or P. After the implant, the dopant must be activated, as shown in step 392.

This activation may be done thermally. This activation may recrystallize the amorphous regions.

Figure 7:
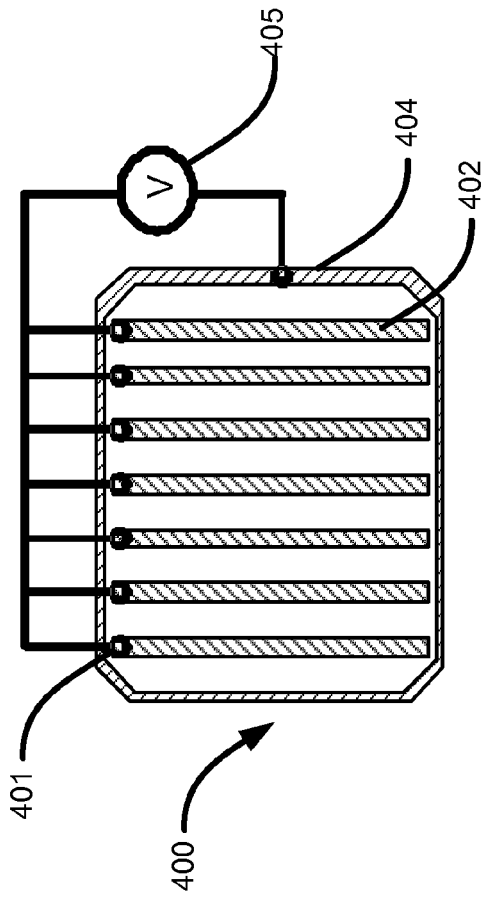
FIG. 7 is of resistive heating of a solar cell.

A polymer is then applied to the surface of the solar cell as shown in step 393. After covering the solar cell with a polymer, this polymer may be opened by resistively heating the solar cell. FIG. 7 shows one embodiment in which resistive heating of a solar cell is achieved. For example, a point contact 401 could be made to each of the lines 402 on the solar cell 400. The second contact for power source 405 may be around the edge 404 of the solar cell 400. As a current, such as between 0.05 ma and 20 mA, is passed between the point contacts 401 and the edge 404, as shown in step 394, heat will be created by the solar cell, based on the resistivity of the regions through which the current passes. The heat dissipated in the undoped regions will be higher than the heat dissipated in the highly doped regions when current flows through the solar cell 400. The higher resistivity of the undoped regions of the solar cell 400 will cause these regions to heat more than the doped regions. Thus, the polymer will evolve or sublime in these undoped regions.

A second patterned implant is then performed using the polymer as the mask, as shown in step 395. The polymer is then removed, using a suitable process, as shown in step 396.

Each of these embodiments discloses a first implant, followed by a second patterned implant. In some embodiments, dopants are introduced in both implants. In other embodiments, the first implant is Si and is used only to transfer the pattern of a shadow or proximity mask onto the solar cell. In some embodiments, the first implant is Si and is used to amorphize the silicon, so that the subsequent process steps can be performed, without changing its doping characteristics. The first implant cannot be Si for the methods illustrated in FIGS. 11 and 13, since these methods rely on characteristics of doped silicon.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of performing a patterned implant in a crystalline substrate, comprising:
    performing a first patterned implant configured to create an amorphous portion of said substrate, wherein a crystalline portion of said substrate remains;
    using a difference in a physical or chemical property between said amorphous and crystalline portions to create a mask over one of said crystalline portion or said amorphous portion; and
    performing a second patterned implant, using said mask created based on said difference to implant a region not covered by said mask.

2. A method of performing a patterned implant in a crystalline substrate, comprising:
    performing a first patterned implant configured to create an amorphous portion of said substrate, wherein a crystalline portion of said substrate remains;
    applying a photoresist to a surface of said substrate;
    applying light in a predetermined frequency range to said surface at a predetermined intensity level, whereby said intensity level is insufficient to set said photoresist;
    using the reflectivity of said substrate to augment said applied light, wherein an amount of light reflected by said amorphous portion is greater than an amount of light reflected by said crystalline portion, wherein the amount of light reflected by one of said portions, when added to said applied light is capable of setting said photoresist, and wherein the amount of light reflected by the other of said portions, when added to said applied light is incapable of setting said photoresist;
    removing photoresist which was not set; and
    exposing said substrate to a second implant, wherein said photoresist masks one of said amorphous portion or said crystalline portion from said second implant.

3. The method of claim 2, wherein said photoresist comprises a positive photoresist, and said positive photoresist masks said amorphous portion from said second implant.

4. The method of claim 2, wherein said photoresist comprises a negative photoresist, and said negative photoresist masks said crystalline portion from said second implant.

5. The method of claim 2, wherein said photoresist is applied at a thickness related to the predetermined frequency range of said light applied to said surface.

6. The method of claim 2, wherein said photoresist is applied at a thickness between 80 nm and 500 nm.

7. The method of claim 2, wherein said predetermined frequency range comprises 100 nm to 2000 nm.

8. The method of claim 2, wherein said photoresist is selected from the group consisting of H-line, I-line, wideband, deep-UV, or any photoactive film where light alters its properties.

9. A method of performing a patterned implant in a crystalline substrate, comprising:
    performing a first patterned implant configured to create an amorphous portion of said substrate, wherein a crystalline portion of said substrate remains;
    applying a thermal polymer to a surface of said substrate;
    applying light in a predetermined frequency range to said substrate at a predetermined intensity level to heat said substrate;
    using the energy absorption of said substrate to heat said polymer, wherein said energy absorption of said amorphous portion is greater than said energy absorption of said crystalline portion such that said amorphous region is sufficiently heated to set said thermal polymer and said energy absorption of said crystalline portion is insufficient to set said thermal polymer;
    removing said thermal polymer which was not set; and
    exposing said substrate to a second implant, wherein said thermal polymer masks said amorphous portion from said second implant.

10. The method of claim 9, wherein said thermal polymer is applied at a thickness between 100 nm and 50 µm.

11. The method of claim 9, wherein said predetermined frequency range comprises infrared light.

12. The method of claim 9, wherein said thermal polymer is selected from the group consisting of polyamides and melamine formaldehyde.

13. The method of claim 9, where said light is applied to said surface of said substrate.

14. The method of claim 9, wherein said substrate comprises a back side, opposite said surface, and wherein said light is applied to said back side of said substrate.

\* \* \* \* \*